United States Patent
Hahto et al.

(10) Patent No.: US 12,112,915 B2
(45) Date of Patent: Oct. 8, 2024

(54) VAPORIZER, ION SOURCE AND METHOD FOR GENERATING ALUMINUM-CONTAINING VAPOR

(71) Applicant: NISSIN ION EQUIPMENT CO., LTD., Koka (JP)

(72) Inventors: Sami K. Hahto, Nashua, NH (US); George Sacco, Groveland, MA (US)

(73) Assignee: NISSIN ION EQUIPMENT CO., LTD., Koka (JP)

( * ) Notice: Subject to any disclaimer, the term of this patent is extended or adjusted under 35 U.S.C. 154(b) by 421 days.

(21) Appl. No.: 17/714,491

(22) Filed: Apr. 6, 2022

(65) Prior Publication Data

US 2023/0326702 A1 Oct. 12, 2023

(51) Int. Cl.
*H01J 37/08* (2006.01)
*C23C 14/48* (2006.01)
*H01J 37/317* (2006.01)

(52) U.S. Cl.
CPC .............. *H01J 37/08* (2013.01); *C23C 14/48* (2013.01); *H01J 37/3171* (2013.01)

(58) Field of Classification Search
CPC ........ H01J 37/08; H01J 37/3171; C23C 14/48
See application file for complete search history.

(56) References Cited

U.S. PATENT DOCUMENTS

| | | |
|---|---|---|
| 5,977,552 A | 11/1999 | Foad |
| 6,998,626 B1 | 2/2006 | Ryding et al. |
| 8,702,920 B2 | 4/2014 | Ikejiri et al. |
| 10,043,635 B2 | 8/2018 | Aya |
| 10,087,520 B2 | 10/2018 | Kamenitsa et al. |
| 10,774,419 B2 | 9/2020 | Kamenitsa et al. |
| 11,107,659 B2 | 8/2021 | Murooka |

FOREIGN PATENT DOCUMENTS

JP 07-054147 A 2/1995

*Primary Examiner* — Nicole M Ippolito
*Assistant Examiner* — Hanway Chang
(74) *Attorney, Agent, or Firm* — Sughrue Mion, PLLC

(57) ABSTRACT

A vaporizer includes a crucible in which an aluminum-containing solid material is placed, and a heater. The crucible includes a chlorine containing gas inlet and a vapor outlet. The heater heats the crucible.

20 Claims, 5 Drawing Sheets

FIG.1

VAPORIZER, ION SOURCE AND METHOD FOR GENERATING ALUMINUM-CONTAINING VAPOR

BACKGROUND

1. Field

The present disclosure relates to a vaporizer, an ion source having the vaporizer, and a method for generating aluminum-containing vapor.

2. Description of Related Art

Silicon carbide (SiC) devices are expected to be used in high-voltage and high-temperature applications such as electric vehicles, railways and power plants, and are featured as one of the items to realize a low-carbon society. The manufacturing process for SiC devices is similar to that of conventional silicon devices in that both use an ion implantation process.

In the ion implantation process for SiC devices, nitrogen or phosphorus ions are implanted as an N-type dopant and aluminum or boron ions are implanted as a P-type dopant into a SiC wafer in the production of a PN junction.

However, since there is no stable gas at room temperature for ion implantation of aluminum ions, plasma generation and ion beam extraction based on a solid material containing aluminum are performed. Related art methods of extracting aluminum ions from a solid material cause extraction electrodes to become insulated over time, requiring an additional cleaning process, which results in undesirable downtime of the ion source and thus the ion implanter. A related art "$H_2$ Co-gas" method is available to address the insulation issue, but increases costs because hydrogen gas must be provided.

SUMMARY

According to an aspect of one or more embodiments, there is provided a vaporizer comprising a crucible in which an aluminum-containing solid material is placed, the crucible comprising a chlorine containing gas inlet and a vapor outlet; and a heater configured to heat the crucible.

According to another aspect of one or more embodiments, there is provided a method for generating aluminum containing vapor, the method comprising heating an aluminum containing solid material in a crucible; and introducing a chlorine containing gas into the crucible.

According to yet another aspect of one or more embodiments, there is provided an ion source comprising a vaporizer comprising a crucible containing an aluminum-containing solid material, the crucible comprising a gas inlet at a first end of the crucible, and a vapor outlet at a second end of the crucible opposite from the first end; and a heater configured to heat the crucible; and an arc chamber in fluid communication with the vapor output, the arc chamber configured to generate a plasma using a vapor that is output from the vapor outlet, wherein the crucible receives a chlorine containing gas through the gas inlet and the chlorine containing gas reacts with the aluminum-containing solid material under heat from the heater to produce the vapor, which is output to the arc chamber through the vapor outlet.

BRIEF DESCRIPTION OF THE DRAWINGS

The above and/or other aspects will become apparent and more readily appreciated from the following description of various embodiments, taken in conjunction with the accompanying drawings, in which:

FIG. 1 is a schematic cross-sectional view of an example of an ion source, according to various embodiments;

DETAILED DESCRIPTION

Figure 2:
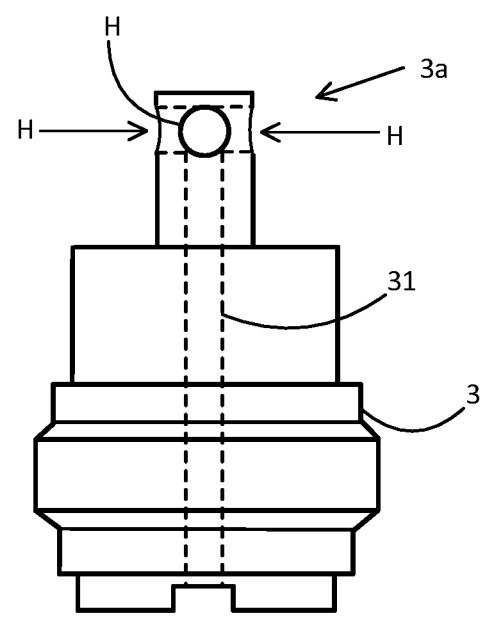
FIG. 2 is a plan view of a first nozzle of the ion source of FIG. 1, according to various embodiments.

As discussed above, in the ion implantation process for SiC devices, nitrogen or phosphorus ions are implanted as an N-type dopant and aluminum or boron ions are implanted as a P-type dopant into a SiC wafer in the production of a PN junction.

Nitrogen gas, phosphine, phosphorus trifluoride or boron trifluoride are stable at room temperature. Therefore, nitrogen gas, phosphine, phosphorus trifluoride or boron trifluoride are used to generate plasma, and an ion beam is extracted from the generated plasma for ion implantation of nitrogen, phosphorus or boron ions to a SiC wafer.

On the other hand, since there is no stable gas at room temperature for ion implantation of aluminum ions, plasma generation and ion beam extraction based on a solid material containing aluminum are performed.

For example, some commercial ion implanters use a related art method of generating plasma from an aluminum-containing target, which is a solid material such as aluminum nitride or aluminum oxide.

In the related art method of generating plasma from the aluminum-containing target, the aluminum-containing target is placed in an arc chamber of an ion source. A corrosive gas containing fluorine components, such as, for example, phosphorus trifluoride or boron trifluoride, is supplied into the arc chamber, and a plasma containing fluorine ions and fluorine radicals are generated from the corrosive gas in the arc chamber. Fluorine ions are trapped by a magnetic field in the arc chamber and attracted to a negative electrode near the aluminum-containing target, physically sputtering the aluminum-containing target. Fluorine radicals react chemically with the aluminum-containing target and sputter the aluminum-containing target chemically.

Physical and chemical sputtering releases aluminum particles from the aluminum-containing target. The aluminum particles collide with energetic electrons emitted from a cathode in the arc chamber, producing aluminum ions in the plasma. An ion beam containing aluminum ions is extracted from the plasma by using extraction electrodes, and finally ion implantation of aluminum ions to a SiC wafer is performed.

During an ion source operation, aluminum fluoride ($AlF_3$), a reaction product of fluorine and aluminum, is deposited on the extraction electrodes. This depositing of the reaction product causes the extraction electrodes to become insulated over time. As a countermeasure against extraction electrode insulation, the operation of the ion source is temporarily stopped to remove the deposits from a surface of the extraction electrodes by a variety of related art cleaning methods such as plasma cleaning and/or ion beam cleaning.

Therefore, there is a disadvantage in that uptime (i.e., the running time) of an ion source is decreased due to the insulation of the extraction electrodes. Stated another way, since the ion implanter must be taken offline for cleaning periodically, the downtime of the ion implanter increases. To solve the insulation issue, a related art "$H_2$ Co-gas" method may be used in which hydrogen gas may be introduced into an arc chamber during an ion source operation to remove a fluorine component that causes insulation of the extraction electrodes.

As a result of the supply of hydrogen gas, gaseous hydrogen fluoride (HF) is generated by the reaction of fluorine and hydrogen in the arc chamber. Finally, gaseous hydrogen fluoride is exhausted to an outside of the ion implanter by a vacuum pump. While the related art "$H_2$ Co-gas" method addresses the insulation issue of the extraction electrodes and prevents a decrease in the uptime of the ion source (i.e., prevents downtime of the ion implanter), the related art "$H_2$ Co-gas" method requires an additional hydrogen gas, and thus increases cost.

Figure 1:
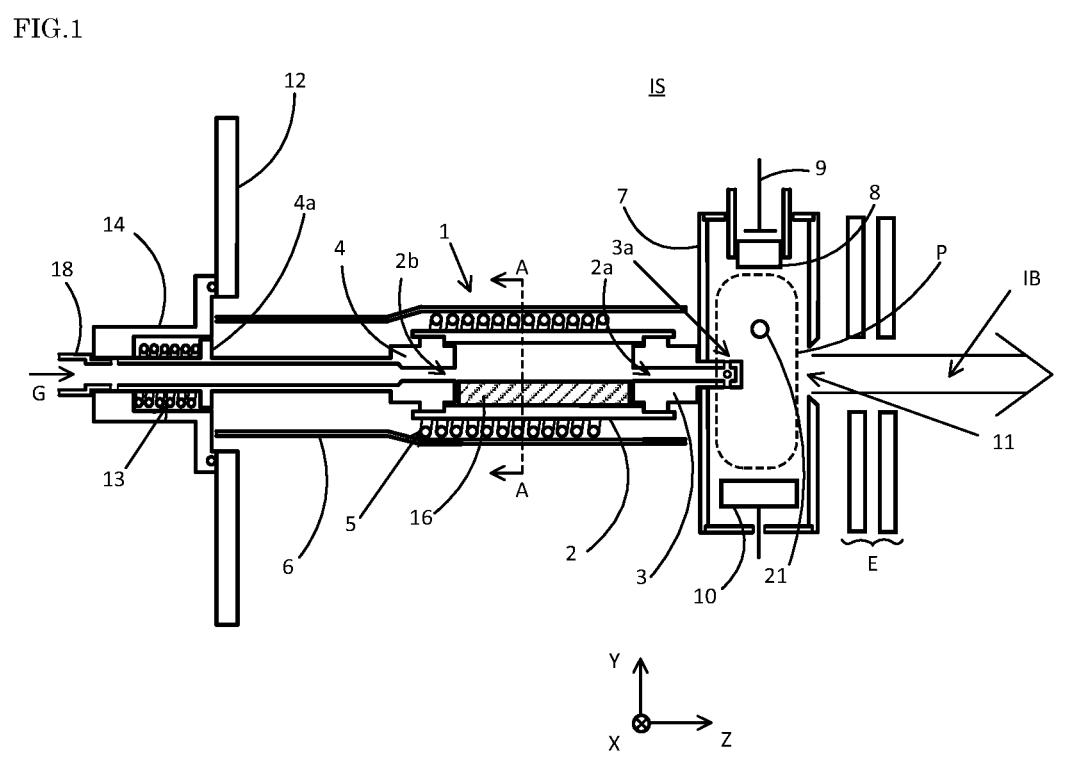

FIG. 1 shows a schematic cross section of an example of an ion source S1, according to various embodiments. The ion source IS is illustrated as an indirectly heated cathode (IHC) ion source by way of example A filament 9 heats a cathode 8 and the cathode 8 emits ionizing electrons inside of an arc chamber 7. A reflecting electrode 10 is positioned opposite the cathode 8 to repel electrons from the cathode 8. An external electromagnet, which is not shown in FIG. 1, generates a magnetic field along a direction connecting the cathode 8 and the reflecting electrode 10.

Aluminum-containing vapor is supplied to the inside of the arc chamber 7 from a vaporizer 1. A plasma P is generated based on the aluminum-containing vapor in the arc chamber 7. An ion beam IB containing aluminum ions is extracted by extraction electrodes E through an aperture 11 of the arc chamber 7. While four extraction electrodes E are illustrated in FIG. 1, the number of extraction electrodes E is exemplary. In some embodiments, the number of extraction electrodes may be more or less that four. Generally, the number of the extraction electrodes may be changed depending on a configuration of the ion source. The vaporizer 1 is equipped with a crucible 2 in which an aluminum-containing solid material 16 (e.g., pure aluminum, aluminum nitride, aluminum oxide and other solid aluminum containing materials including solid powder) is placed.

The crucible 2 illustrated in FIG. 1 is a cylindrical member that is longer in one direction. For example, as shown in FIG. 1, an axis of the crucible 2 may extend along a longitudinal direction (e.g., the Z-axis direction in FIG. 1). One end of the crucible 2 in the longitudinal direction has a vapor outlet 2a for supplying aluminum-containing vapor to the arc chamber 7, and the other end of the crucible 2 in the longitudinal direction has a chlorine containing gas inlet 2b to deliver a chlorine containing gas into the crucible 2. In some embodiments, the chlorine containing gas may be, for example, a chlorine gas ($Cl_2$) or hydrogen chloride gas (HCl).

A first nozzle 3 and a second nozzle 4 are removably attached to the crucible 2. The first nozzle 3 and the second nozzle 4 are respectively a roughly elongated cylindrical member. In some embodiments, the first nozzle 3, the second nozzle 4, and the crucible 2 may be made of graphite. However, graphite is only an example and, in some embodiments, another material may be used. The second nozzle 4 includes a portion located on the opposite end of the crucible 2 from the first nozzle 3, and a long cylindrical portion that extends in the −Z axis direction to the end of the ion source IS. Various methods (e.g., fitting and/or screwing) may be used to attach the first nozzle 3 and the second nozzle 4 to the crucible 2. The first and second nozzles 3 and 4 are used to extend a vapor outlet 2a and a chlorine containing gas inlet 2b of the crucible 2.

In FIG. 1, arrow G denotes a flow of a supply of chlorine containing gas. The chlorine containing gas passes through the second nozzle 4, the crucible 2, and the first nozzle 3 and into the arc chamber 7, in that order. In the crucible 2, the chlorine containing gas reacts with the aluminum-containing solid material 16 that is heated to a high temperature to generate aluminum-containing vapor including aluminum chloride ($AlCl_3$) and other aluminum particles. The aluminum-containing vapor and chlorine containing gas are fed from crucible 2 to arc chamber 7 through the first nozzle 3.

In some embodiments, the aluminum-containing solid material 16 may be pure aluminum. Pure aluminum increases an aluminum ratio of the aluminum-containing vapor, and also increases an ion beam current of the ion beam extracted from the ion source S1. However, embodiments are not limited to pure aluminum, and in some embodiments, aluminum nitride, aluminum oxide and/or other solid aluminum containing materials may be used.

The supply of chlorine containing gas G to the second nozzle 4 may be done through a member 18 fitted inside of the second nozzle 4, as shown in FIG. 1. For example, in some embodiments, the chlorine containing gas G may be supplied from a gas source configured to supply the chlorine containing gas. The specific configuration of the gas source is not particularly limited as long as the gas source is capable of supplying a chlorine containing gas to the member 18. In some embodiments, the crucible 2, the first nozzle 3, the second nozzle 4 and other components that serve as flow paths for chlorine containing gas may be made of corrosion-resistant carbon materials.

The end portion 3a of the first nozzle 3, opposite from an end of the first nozzle 3 attached to the crucible 2, protrudes into the arc chamber 7. The end portion 3a has holes for vapor supply in four orthogonal directions so that aluminum-containing vapor may be diffused and supplied in multiple directions inside of the arc chamber 7.

FIG. 2 shows an example of a more detailed configuration of the first nozzle 3 of the ion source IS in FIG. 1. The dashed line in FIG. 2 indicates a flow path 31 for chlorine containing gas and aluminum-containing vapor. The flow path 31 leads to apertures H at the end portion 3a of the first nozzle 3. Each aperture H is a round hole that connects the inside and outside of the first nozzle 3 on the front, back, left and right sides of the first nozzle 3 in FIG. 2, and thus the first nozzle 3 may supply the chlorine containing gas and aluminum-containing vapor into the arc chamber 7 in four directions. While four apertures are described with respect to FIGS. 1-2, the number of apertures H is not limited to four. In some embodiments, the number of apertures H may be less than four or greater than four. As the number of apertures increase, it may be possible to supply the aluminum-containing vapor to the arc chamber 7 in more directions.

Returning to FIG. 1, a coil heater 5 with a thermocouple is wound around a periphery of crucible 2. The aluminum-containing solid material 16 is heated to a high temperature by the heater 5 and reacts with the chlorine containing gas to generate the aluminum-containing vapor. A heat shield 6 is placed around a periphery of the heater 5 to block heat radiation from the heater 5.

In some embodiments, the second nozzle 4 may have a large diameter section 4a. In some embodiments, a flange 14 may be provided to attach the vaporizer 1 to an ion source flange 12. A coil spring 13 may be provided between the flange 14 and the large diameter section 4a of the second nozzle 4. The coil spring 13 forces vaporizer 1 against a side wall of the arc chamber 7 to prevent aluminum-containing vapor and/or chlorine containing gas from leaking out between the first nozzle 3 and the arc chamber 7. In some embodiments, one or more gaskets (not shown) may also be provided between the vaporizer 1 and the side wall of the arc chamber 7 to prevent gas leakage between the first nozzle 3 and the arc chamber 7. In some embodiments, a damper, for example, a spring clip in the form of a snap ring, may be attached to the first nozzle 3 in order to avoid excess pressure by the elastic force of the coil spring 13. In still other embodiments, a damper, for example, a spring clip, may be provided between the large diameter section 4a of the second nozzle 4 and the inner wall of the heat shield 6 in order to prevent the excess pressure by the elastic force of the coil spring 13. In some embodiments, one or all of one or more gaskets, a snap ring, and/or a spring clip may be provided. It is noted that the gaskets, snap ring and spring clip are only examples and, in other embodiments, different or additional structures may be used. The ion source flange 12 also indirectly supports the arc chamber 7 and other components around the arc chamber 7 such the filament 9 and the cathode 8 by supporting parts not shown in FIG. 1.

Figure 3:
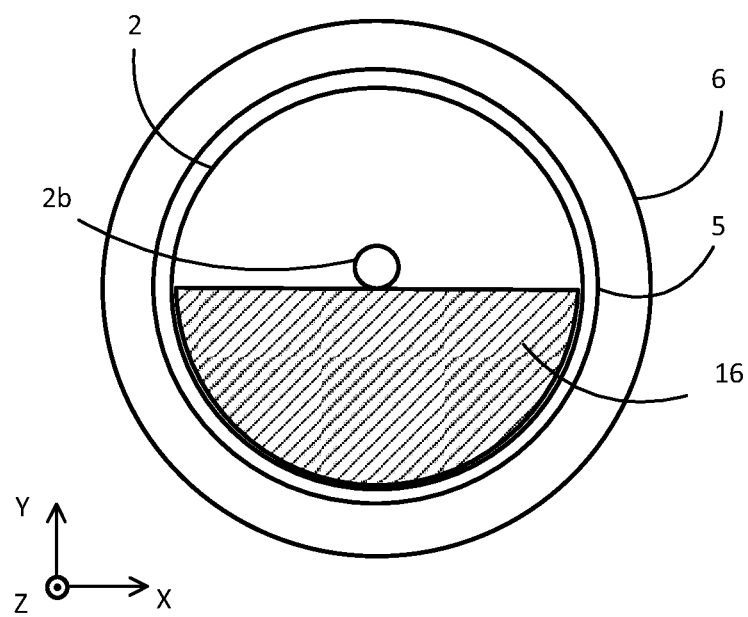
FIG. 3 is a cross-sectional view of line A-A in FIG. 1.

FIG. 3 is a cross-sectional view at line A-A in FIG. 1. It is noted that the view in FIG. 3 is shown looking toward the chlorine containing gas inlet 2b. It is noted that the view in FIG. 3 is shown looking toward the chlorine containing gas inlet 2b, by way of example. However, as will be understood from FIGS. 1 and 3 taken together, the view in the opposite direction, i.e., looking toward the vapor outlet 2a, may be substantially the same as that illustrated in FIG. 3. In other words, in some embodiments, the top edge of the aluminum-containing solid material 16 may also coincide with a bottom edge of the vapor outlet 2a.

As shown in FIG. 3, in some embodiments, the aluminum-containing solid material 16 may be a semi-circular material in cross section, and a top edge of the aluminum-containing solid material 16 may coincide with a bottom edge of the chlorine containing gas inlet 2b. With this configuration, the chlorine containing gas flows along the surface of the solid material 16, allowing the chlorine containing gas to react efficiently with the aluminum-containing solid material 16. That is, the configuration shown in FIG. 3 has an advantage in that a reaction between chlorine containing gas and the aluminum-containing solid material 16 is accelerated. However, this configuration is only an example, and in other embodiments, a cross-sectional shape of the aluminum-containing solid material 16 may be changed depending on a cross-sectional shape of the crucible 2. That is, while FIG. 3 illustrates the aluminum-containing solid material 16 with a semi-circular cross-section, embodiments are not limited to a semi-circular cross-section and, in some embodiments, the aluminum-containing solid material 16 may take up a larger or smaller volume within an interior of the crucible 2 as long as the aluminum-containing solid material 16 does not block the second nozzle 4 and the first nozzle 3. In some embodiments, the aluminum-containing solid material 16 may be provided as a plurality of rods and/or plates extending in the longitudinal direction of the crucible 2 to facilitate a reaction between the chlorine containing gas and the aluminum-containing solid materials 16. In such a configuration, the rods and/or plates may be suspended within the interior of the crucible 2 by a support fixture. In some embodiments, a diameter of the crucible 2 may be similar to or the same as diameters of the chlorine containing gas inlet 2b and the vapor outlet 2a.

It is noted that with a semi-circular cross-section of the aluminum-containing solid material 16, substantially half of an interior volume of the crucible 2 (e.g., the top half in the example illustrated in FIG. 3) is an open space in which the chlorine containing gas may react with the aluminum-containing solid material 16. In this regard, a smaller open space is more advantageous in consideration of efficiency of delivery of the aluminum-containing vapor to the arc chamber 7. However, if the open space is too small, there is a higher possibility that aluminum-containing vapor will leak into the arc chamber 7, because pressure in crucible 2 would be higher due to residual aluminum-containing vapor vaporized by heat transfer from the arc chamber 7 after the coil heater 5 switches off, resulting in unwanted contamination of the ion species.

During operation of the ion source IS, a temperature of the extraction electrodes E becomes around 400-500 Celsius. There are no deposits formed on a surface of the extraction electrodes E, based on aluminum chloride which is main ingredient of aluminum-containing vapor, because the boiling point of aluminum chloride included in aluminum-containing vapor is around 180 Celsius. Therefore, in the ion source IS according to various embodiments described above, the insulation issue with the extraction electrodes E becoming insulated over time and requiring cleaning is avoided. That is, with ion source IS according to various embodiments, it is not necessary to use hydrogen gas in a method such as the "$H_2$ Co-gas" method to avoid the insulation issue of the extraction electrodes E becoming insulated over time as in the related art.

Ion species other than aluminum ions are also used to fabricate PN junctions. The chlorine containing gas flow path in the vaporizer 1 may be used for supplying other gas species ($PH_3$, $PF_3$, $BF_3$ and $N_2$, etc.). However, a reaction product generated by the reaction between the aluminum-containing solid material 16 in the crucible 2 and other gas species and other reaction products generated by the reaction between a residual gas and/or a residual vapor in the chlorine containing gas flow path and other gas species may cause unexpected discharge or other disadvantages.

Therefore, it is advantageous to separate a flow path for other gas species from the chlorine containing gas flow path.

Figure 4:
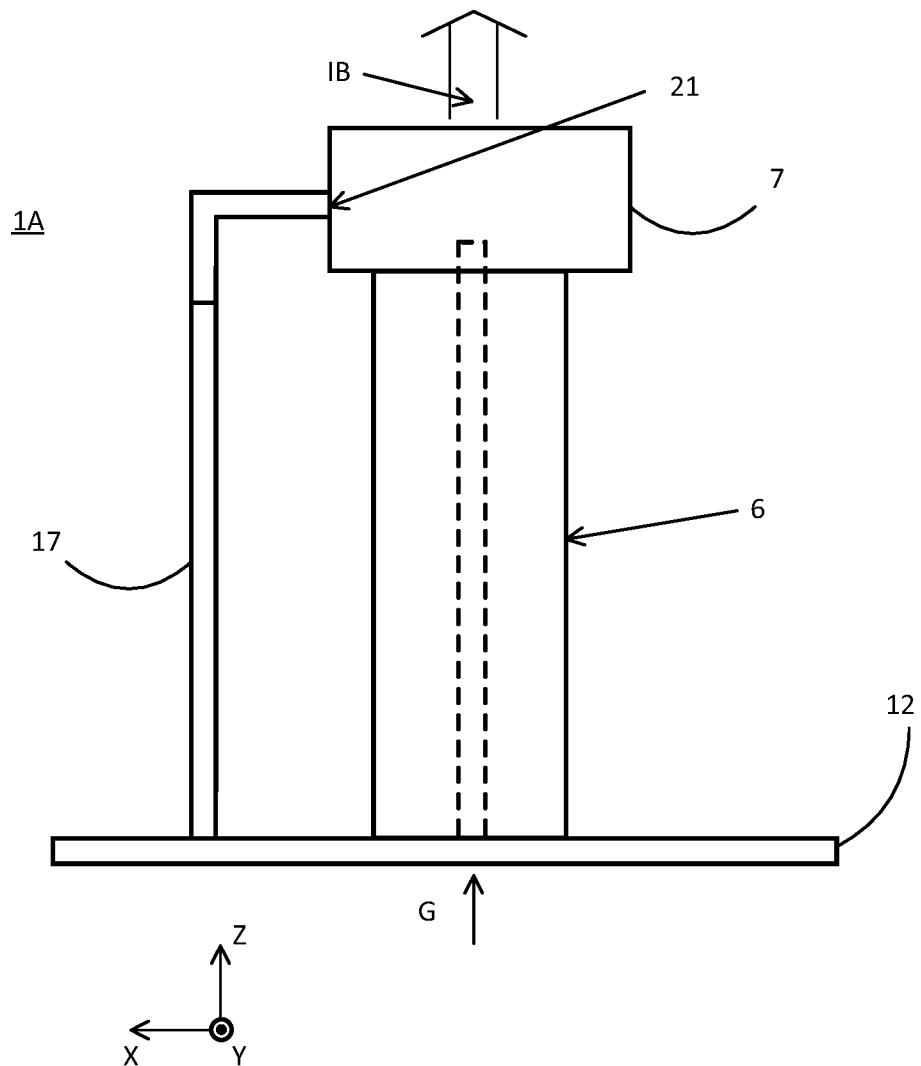
FIG. 4 is a schematic plan view of another example of an ion source according to various embodiments.

FIG. 4 is a schematic plan view of another example of an ion source, according to various embodiments. In FIG. 4, like reference numbers refer to like elements and a repeated description thereof is omitted for conciseness. As illustrated in FIG. 4, an ion source 1A includes the arc chamber 7 and a crucible 2. The arc chamber 7 is provided with an inlet aperture 21 on a side wall of the arc chamber 7 to which an L-shaped gas piping 17 is connected to supply other gas species into the arc chamber 7. For example, in some embodiments, the gas of the other species may be supplied from a gas source configured to supply the gas of the other gas species. The specific configuration of the gas source is not particularly limited as long as the gas source is capable of supplying a gas of the other gas species to the gas piping 17 and ultimately to the inlet aperture 21.

The above description is provided using an example of an IHC ion source. However, an IHC source is only one example embodiment and, in other embodiments, other types of ion sources such as a Bernus ion source and a Radio frequency inductively coupled plasma ion source, etc. may be used as the ion source IS.

Figure 5:
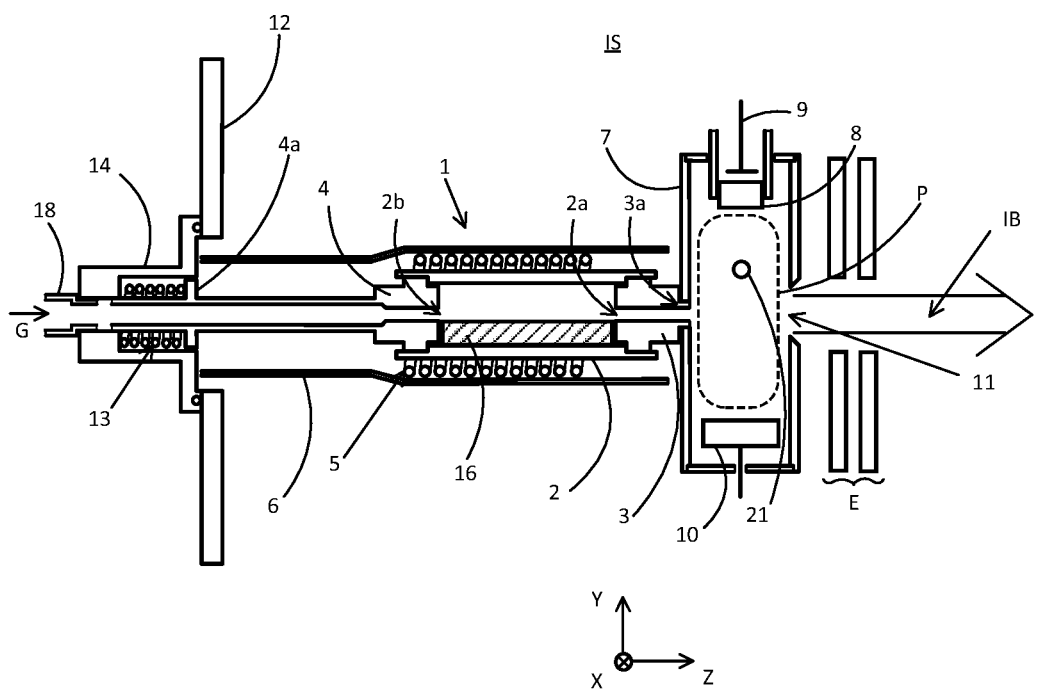
FIG. 5 is a schematic cross-sectional view of another example of an ion source, according to various embodiments.

FIGS. 1-2 show a configuration in which the end portion 3a of the first nozzle 3 protrudes into the arc chamber 7, but this configuration is only an example. In other embodiments, the end portion 3a of the first nozzle 3 may flush with the wall of the arc chamber 7, shown in another example of the ion source IS illustrated in FIG. 5. In the configuration illustrated in FIG. 5, the number of apertures H formed in the end 3a of the first nozzle 3 is one in Z direction.

FIGS. 1 and 5 illustrate examples of an ion source IS in which only one first nozzle 3 and only one second nozzle 4 are provided. However, in some embodiments, multiple inlets, e.g., a plurality of the second nozzles 4 may be provided, for example, by an inlet block in order to enlarge a contact area between the chlorine containing gas and the aluminum-containing solid material 16. Alternatively or additionally, in some embodiments, a plurality of the first nozzles 3 may be provided, for example, by an outlet block.

It should be understood that embodiments are not limited to the various embodiments described above, but various other changes and modifications may be made therein without departing from the spirit and scope thereof as set forth in appended claims.

What is claimed is:

1. A vaporizer comprising:
a crucible in which an aluminum-containing solid material is placed, the crucible comprising a chlorine containing gas inlet and a vapor outlet; and
a heater configured to heat the crucible.

2. The vaporizer as recited in claim 1, wherein the aluminum-containing solid material is pure aluminum.

3. The vaporizer as recited in claim 1, wherein the vapor outlet outputs a vapor in a plurality of directions.

4. The vaporizer as recited in claim 1, wherein an edge of the chlorine containing gas inlet is aligned with a surface of the aluminum-containing solid material.

5. An ion source comprising:
the vaporizer according to claim 1;
an arc chamber configured to generate a plasma therein, wherein the vapor outlet of the vaporizer is configured to output vapor into the arc chamber through a wall of the arc chamber.

6. The ion source as recited in claim 5, wherein the aluminum-containing solid material is pure aluminum.

7. The ion source as recited in claim 5, wherein the vapor outlet comprises an end portion that extends through the wall of the arc chamber, the end portion comprising a plurality of holes at a distal end thereof.

8. The ion source as recited in claim 5, wherein an edge of the chlorine containing gas inlet is aligned with a surface of the aluminum-containing solid material.

9. The ion source as recited in claim 5, wherein the crucible is biased to the arc chamber by an elastic force.

10. The ion source as recited in claim 5, wherein the arc chamber receives aluminum containing vapor output from the vapor outlet of the crucible and receives a gas that does not contain aluminum from a flow path that does not pass through the crucible.

11. A method for generating aluminum containing vapor, the method comprising:
heating an aluminum containing solid material in a crucible; and
introducing a chlorine containing gas into the crucible.

12. The vaporizer as recited in claim 1, wherein the crucible is cylindrical and extends in a longitudinal direction,
the chlorine containing gas inlet is provided at a first end of the crucible in the longitudinal direction, and
the vapor outlet is provided at a second end of the crucible opposite from the first end in the longitudinal direction.

13. A vaporizer comprising:
a first gas source comprising a chlorine containing gas;
a crucible containing an aluminum-containing solid material, the crucible comprising a gas inlet communicatively connected to the first gas source, and a vapor outlet; and
a heater configured to heat the crucible.

14. The vaporizer as recited in claim 13, wherein the aluminum-containing solid material is pure aluminum.

15. An ion source comprising:
a first gas source comprising a first gas that contains chlorine;
a vaporizer comprising:
a crucible containing an aluminum-containing solid material, the crucible comprising a gas inlet communicatively connected to the first gas source, and a vapor outlet; and
a heater configured to heat the crucible;
an arc chamber configured to generate a plasma therein, wherein the vapor outlet of the vaporizer is configured to output vapor into the arc chamber through a wall of the arc chamber.

16. The ion source as recited in claim 15, further comprising:
a second gas source comprising a second gas that does not contain aluminum,
wherein the arc chamber comprises a gas inlet communicatively connected to the second gas source, and
wherein a flow path from the second gas source to the gas inlet of the arc chamber does not pass through the crucible.

17. An ion source comprising:
a vaporizer comprising:
a crucible containing an aluminum-containing solid material, the crucible comprising a gas inlet at a first end of the crucible, and a vapor outlet at a second end of the crucible opposite from the first end; and
a heater configured to heat the crucible; and
an arc chamber in fluid communication with the vapor output, the arc chamber configured to generate a plasma using a vapor that is output from the vapor outlet,
wherein the crucible receives a chlorine containing gas through the gas inlet and the chlorine containing gas reacts with the aluminum-containing solid material under heat from the heater to produce the vapor, which is output to the arc chamber through the vapor outlet.

18. The ion source of claim 17, further comprising a first gas source in fluid communication with the gas inlet, the first gas source containing the chlorine containing gas.

19. The ion source as recited in claim 17, wherein the arc chamber comprises a gas inlet, and
wherein a flow path to the gas inlet of the arc chamber of a second gas that does not contain aluminum does not pass through the crucible.

20. The ion source as recited in claim 19, further comprising:
a second gas source comprising the second gas that does not contain aluminum, the second gas source being in fluid communication with the gas inlet of the arc chamber,
wherein the flow path from the second gas source to the gas inlet does not pass through the crucible.

* * * * *